United States Patent

Schmitt-Landsiedel et al.

[11] Patent Number: 5,825,686
[45] Date of Patent: Oct. 20, 1998

[54] MULTI-VALUE READ-ONLY MEMORY CELL HAVING AN IMPROVED SIGNAL-TO-NOISE RATIO

[75] Inventors: Doris Schmitt-Landsiedel, Ottobrunn; Roland Thewes, Puchheim; Michael Bollu, München; Paul-Werner von Basse, Wolfratshausen, all of Germany

[73] Assignee: Siemens Aktiengesellschaft, Munich, Germany

[21] Appl. No.: 875,955

[22] PCT Filed: Feb. 5, 1996

[86] PCT No.: PCT/DE96/00168

§ 371 Date: Aug. 11, 1997

§ 102(e) Date: Aug. 11, 1997

[87] PCT Pub. No.: WO96/25741

PCT Pub. Date: Aug. 22, 1996

[30] Foreign Application Priority Data

Feb. 16, 1995 [DE] Germany .................. 195 05 293.5

[51] Int. Cl.⁶ .................................................. G11C 11/34
[52] U.S. Cl. .................. 365/185.03; 365/94; 365/104; 365/105
[58] Field of Search .................. 365/185.03, 185.01, 365/94, 104, 105

[56] References Cited

U.S. PATENT DOCUMENTS 5,296,726  3/1994  MacElwee .......................... 257/213
5,402,374  3/1995  Tsuruta et al. ....................... 365/94

FOREIGN PATENT DOCUMENTS 0590319   4/1994   European Pat. Off. .
0643489   3/1995   European Pat. Off. .
3842511   6/1989   Germany .
2157489  10/1985   United Kingdom .

OTHER PUBLICATIONS

IBM Technical Disclosure Bulletin, vol. 28, No. 7, Dec. (1985), New York, "Read only memory", pp. 3048–3049.

*Primary Examiner*—Vu A. Le
*Attorney, Agent, or Firm*—Hill & Simpson

[57] ABSTRACT

The invention concerns a multi-valued read-only storage location which is constructed symmetrically for storing a first or second state (M, M''') and asymmetrically for storing at least a third state (M', M''). The advantage thereof is above all that the storage capacity is doubled without notably increasing expenditure and without impairing the signal-to-noise ratio with respect to conventional storage locations. The invention is suitable for electrically programmable and mask-programmable read-only memories, in particular for those used in low voltage technology.

3 Claims, 3 Drawing Sheets

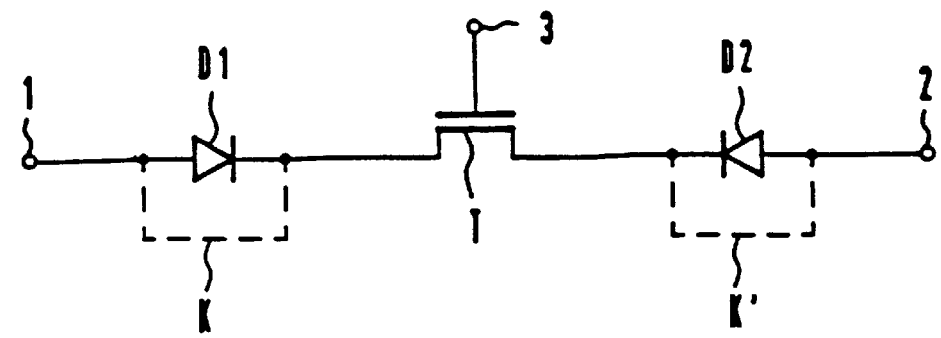
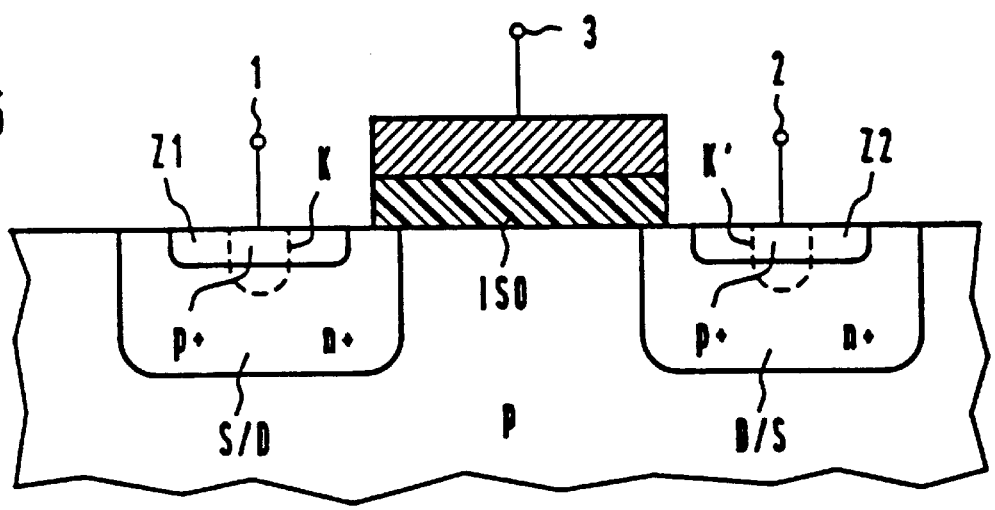
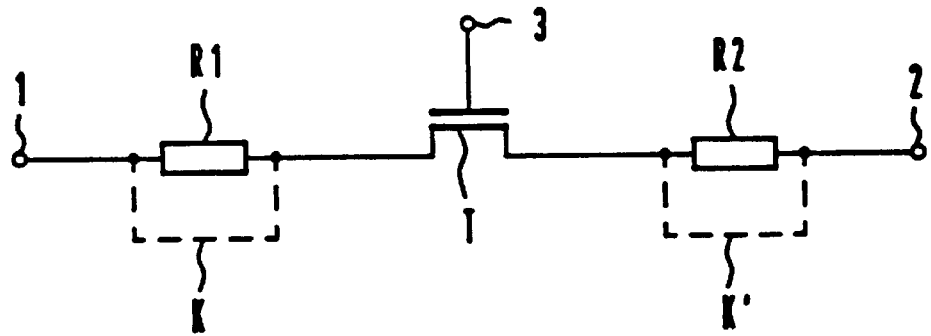

MULTI-VALUE READ-ONLY MEMORY CELL HAVING AN IMPROVED SIGNAL-TO-NOISE RATIO

BACKGROUND OF THE INVENTION

Conventional memory cells can each store 1 bit of information. The two states of the cell may be, for example, a high or low threshold voltage of the transistor in a 1-transistor memory cell. During the read-out operation, the bit lines in many known arrangements are initially precharged to a defined voltage. When the cell is driven via the word line, the charge of the bit line connected to the cell is changed to a greater or lesser extent depending on the state of the cell. In this way, the information of the cell can be read out via a high or low level of the bit line. In order to achieve high interference immunity, the two levels must have the maximum possible voltage difference, for example positive supply voltage and 0 volts.

In order to increase the information density, multi-value memory cells have also occasionally been used, in particular in read-only memories. Multi-value memory cells are memory cells which each have a storage capacity of more than 1 bit.

The international patent application with the publication number WO 82/02977 has disclosed a mask-programmable read-only memory (ROM) in whose memory cells it is possible to store more than only two logic states. In order to obtain cells each having the same, minimum size, the logic states are in this case programmed into the cells by setting the threshold voltage of the transistor situated in the respective cell separately in each case.

This necessitates the reliable differentiation between a plurality, for example four, of different voltage or current values. This means a higher outlay on circuitry, for example for stabilized reference voltages, and, above all, a reduced interference immunity. This can also lead to reduced efficiency. This, presumably, is why multi-value memory cells have not attained any practical significance to date. In modern memories with a reduced supply voltage, for example with 3.3 V, the disadvantages cited are even less acceptable.

The document GB-A-2 157 489 discloses a multi-value read-only memory cell which is of symmetrical construction for storing a first or second state and of asymmetrical construction for storing a third or fourth state.

SUMMARY OF THE INVENTION

The invention is based on the object, then, of specifying a multi-value memory cell in which the minimum possible outlay on circuitry is required and in which the signal-to-noise ratio is significantly improved in comparison with known multi-value memory cells.

In general terms the present invention is a multi-value read-only memory cell has symmetrical construction for storing one of a first state and a second state and having asymmetrical construction for storing at least a third state. A MOS field-effect transistor has a source/drain region situated in a semiconductor body and has a drain/source region situated in the semiconductor body. In order to store the first state, a first cell connection is connected directly to the source/drain region of the MOS field-effect transistor and a second cell connection is connected directly to the drain/source region of the MOS field-effect transistor. In order to store the second state, the first cell connection is connected via a first component to the source/drain region of the MOS field-effect transistor, and the second cell connection is connected via a second component to the drain/source region of the MOS field-effect transistor. In order to store the third state, the first cell connection is connected via the first component to the source/drain region of the MOS field-effect transistor, and the second cell connection is connected directly to the drain/source region of the MOS field-effect transistor. In order to store a fourth state, the first cell connection is connected directly to the source/drain region of the MOS field-effect transistor and the second cell connection is connected via the second component to the drain/source region of the MOS field-effect transistor. A third cell connection is connected to a gate electrode of the MOS field-effect transistor, drain/source region, the same doping in order to store the gate electrode being electrically insulated from the semiconductor body by an insulation layer. The first component is a first diode and the second component is a second diode.

Advantageous developments of the present invention are as follows.

In order to form the first diode, the first cell connection is connected via a first supplementary region to the source/drain region of the MOS field-effect transistor. In order to form the second diode, the second cell connection is connected via a second supplementary region to the drain/source region of the MOS field-effect transistor. In order to store the first state, first and second supplementary regions are bridged by metallic contact links of the first and second connections, which contact links have a deep structure and extend at least as far as the source/drain region and drain/source region. In order to store the second state, both the first and second supplementary regions are contacted only by metallic contact links of the first and second connections, which contact links are planar and extend only at least as far as the first and second supplementary regions. In order to store the third state, only the first supplementary region is bridged by a metallic contact link of the first connection, which contact link has a deep structure and extends at least as far as the source/drain region. In order to store the fourth state, only the second supplementary region is bridged by a metallic contact link of the first connection, which contact link has a deep structure and extends at least as far as the drain/source region.

In another embodiment the memory cell has symmetrical construction for storing a first state and a second state and asymmetrical construction for storing at least a third state. A MOS field effect transistor has a source/drain region situated in a semiconductor body and a drain/source region situated in the semiconductor body. In order to store the first state a first cell connection is connected directly to the source/drain region of the MOS field-effect transistor, and a second cell connection is connected directly to the drain/source region of the MOS field-effect transistor. In order to store the second state, the first cell connection connected via a first component to the source/drain region of the MOS field-effect transistor and the second cell connection connected via a second component to the drain/source region of the MOS field-effect transistor. In order to store the third state, the first cell connection is connected via the first component to the source/drain region of the MOS field-effect transistor, and the second cell connection is connected directly to the drain/source region of the MOS field-effect transistor. In order to store a fourth state, the first cell connection is connected directly to the source/drain region of the MOS field-effect transistor, and the second cell connection is connected via the second component to the drain/source region of the MOS field-effect transistor. In order to store the third state, the first cell connection is connected via the first component to the source/drain region of the MOS field-effect transistor, and the second cell connection is connected directly to the drain/source region of the MOS field-effect transistor. In order to store a fourth state, the first cell connection is connected directly to the source/drain region of the MOS field-effect transistor, and the second cell connection is connected via the second component to the drain/source region of the MOS field-effect transistor. A third cell connection connected to a gate electrode of the MOS field-effect transistor, the gate electrode being electrically insulated from the semiconductor body by an insulation layer. The first component is a first resistor and the second component is a second resistor.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 4 shows a circuit diagram of a first further memory cell according to the invention, FIG. 5 shows a sectional representation to explain the production of the memory cell of FIG. 4, and FIG. 6 shows a circuit diagram of a second further memory cell according to the invention.

DESCRIPTION OF THE PREFERRED EMBODIMENTS

Figure 1:
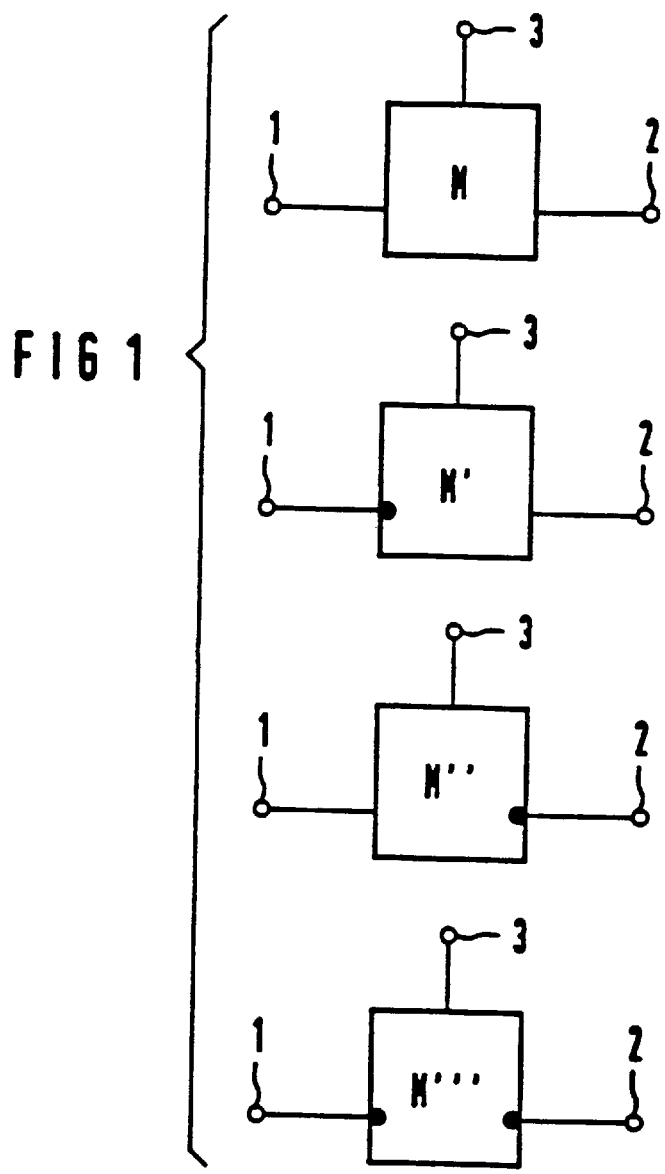
FIG. 1 shows illustrations of a memory cell in the four possible states.

FIG. 1 illustrates memory cells according to the invention with their respective cell connections 1, 2 and 3, which memory cells are programmed in four different states M, M', M", M"'. In this case, the memory cell with the state M has no marking, the memory cell with the state M' has a marking in the form of a spot at the cell connection 1, the memory cell with the state M" has a marking in the form of a spot at the cell connection 2 and the memory cell with the state M"' has a marking in the form of a spot both at the cell connection 1 and the cell connection 2. The memory cells with the stored states M and M"' are therefore symmetrical with respect to the cell connections 1 and 2, and the memory cells with the stored states M' and M" are therefore asymmetrical with respect to the cell connections 1 and 2.

FIGS. 2A to 2D show by way of example the storage of 4 states in an n-channel transistor, which is situated, for example, in a one-time programmable memory cell (OTP memory cell).

Figure 2A:
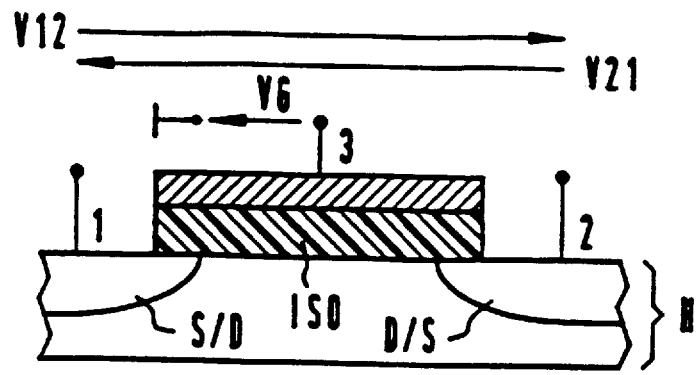
FIGS. 2A to 2D show different designs of MOS transistors of a memory cell, for realizing four different memory states.
Figure 2B:
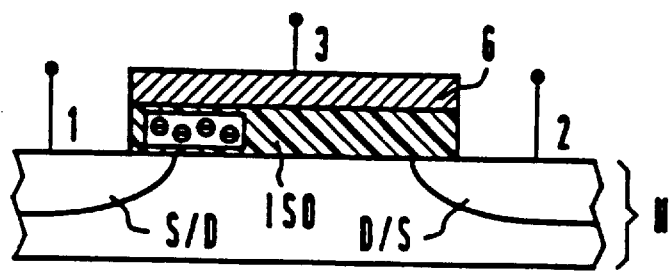
Figure 2C:
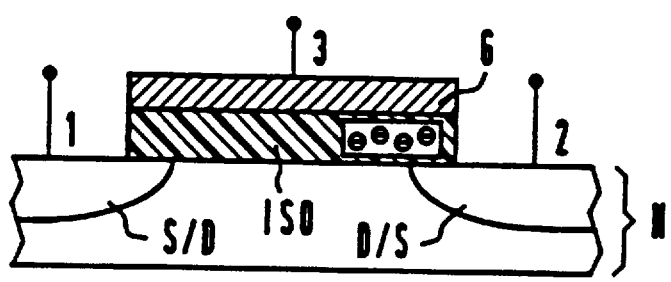
Figure 2D:
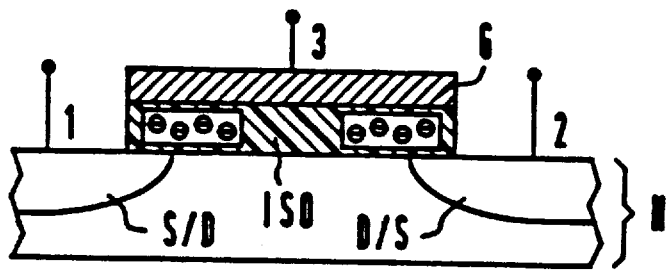

In this case, FIG. 2A shows the unprogrammed symmetrical MOS transistor. In the MOS transistor of FIG. 2B, negative charges have been introduced within a region in the gate oxide near to the cell connection 1. This means that a higher gate voltage VG is necessary to produce an inversion channel underneath this region than under the gate oxide near to the cell connection 2. In simple terms, this means that the threshold voltage VT near to the cell connection 1 is locally increased. During operation of an MOS transistor in the saturation region (drain-source voltage VDS>VG-VT), the onset of conductivity is determined approximately only by the threshold voltage near to the source connection. By definition, the source connection is that cell connection 1 or 2 which has the lower voltage. In the event of driving cell connection 1 as the source, a high threshold voltage is thus produced, and in the event of driving cell connection 2 as the source, a low threshold voltage is consequently produced. In FIG. 2C, the cell connections 1 and 2 are virtually just changed over from the arrangement of 2B and the relationships are correspondingly reversed. On the other hand, FIG. 2D shows the case where the threshold voltage is increased on both sides.

Figure 3:
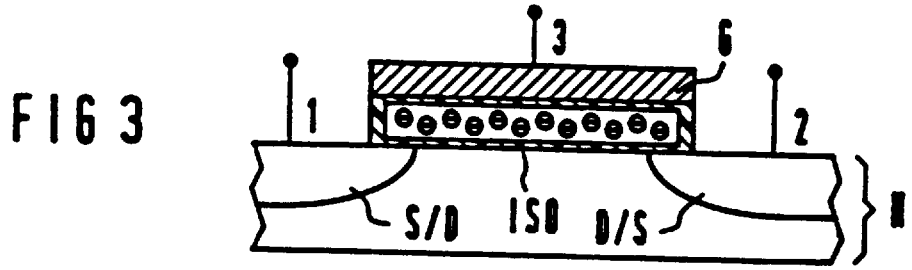
FIG. 3 shows a different embodiment variant of FIG. 2D.

FIG. 3 shows the case where the threshold voltage is increased in the entire channel. The transistors of FIG. 2D and FIG. 3 are equivalent as regards the electrical characteristics, but different programming methods can be used, which is, however, explained in more detail below.

The following table indicates, in order for the transistors shown in FIGS. 2A to 2D and FIG. 3, the threshold voltage VT as a function of the polarity of the voltage VDS at the cell connections 1 and 2, and also the associated cell information as a 2-bit number. It is noteworthy here that the signal to be read out has the same high signal-to-noise ratio as a conventional 1-bit memory cell.

| VT where VDS = V21 > 0 | VT where VDS = V12 > 0 | Cell information |
|---|---|---|
| low | low | 0 0 M |
| low | increased | 0 1 M' |
| increased | low | 1 0 M" |
| increased | increased | 1 1 M"' |

The distinction between the state M" and M"' can be made, for example, by initially applying a fixed level to the first cell connection 1, precharging the bit line at the cell connection 2 to a precharged level, where the latter differs from the fixed level at the cell connection 1, and subsequently assessing the change in the bit line potential following activation of the memory cell. After this, the fixed level is applied to the cell connection 2, the bit line at the cell connection 1 is precharged and the change in potential of the bit line is assessed once more.

The assessment can also be carried out by initially applying a first fixed level to the cell connection 1 and assessing the level of the bit line at the cell connection 2 and, after this, applying a second fixed level to the cell connection 1 and once more assessing the level of the bit line at the cell connection 2.

The memory cell according to the invention is particularly suitable, for example, for one-time programmable memories (OTP). The programming can be carried out here by local injection of electrons into an oxide-nitride-oxide layer (ONO), which represents at least one constituent of the insulation layer ISO of the MOS field-effect transistor, or else into a conventional oxide layer. When injecting "hot" charges at a high VDS, these charges are in this case injected into a small region in the vicinity of the drain region. The advantages of so-called ONO layers over conventional oxide layers are that they have a high capture probability for electrons and that there is virtually no lateral movement of these charges. The state according to FIG. 3 can be effected by homogeneous injection.

A further embodiment of the invention is constituted by the channel region in the vicinity of one connection having a different doping than the rest of the channel of the MOS field-effect transistor. This can be effected, for example, by means of an implantation mask, the opening of which covers only part of the channel region. It is also possible for an additional doping to be implanted at the drain before the source/drain implantation and with the source region covered, for example, and to be diffused into the channel from the drain side of the transistor.

The mask required for this is self-aligning and therefore less critical. It is further conceivable to carry out the source/drain implantations optionally at shallow and at acute angles. Implantation at acute angles, for example of 0 to approximately 7 degrees, is known from standard technologies. There is experience with shallow angles, for example of 30 to 60 degrees, in the development of LATID transistors (Large-Angle-Tilted-Implanted-Drain). The mask for the implantation at a shallow angle is relatively non-critical, since it has to overlap the relevant source/drain regions only in the transition region to the gate oxide and may arbitrarily overlap the channel region.

As an alternative to increasing the threshold voltage, it is also possible to reduce the threshold voltage, for example by introducing positive charges.

Furthermore, corresponding memory elements can be realized, of course, not only using n-channel transistors, but also using p-channel transistors.

In order to produce the asymmetry of the transistor, it is conceivable not only to influence the threshold voltage, but also, for example, to change the oxide thickness or have different transistor widths near to the source and/or drain connection.

Furthermore, when the memory cell is being read out, it is possible to distinguish between three different transistor states in that the transistor is operated either in the linear region, that is to say with a drain-source voltage VDS which is less than the gate voltage reduced by the threshold voltage VT (VDS<VG-VT), or in the saturation region. In this case, the polarity of the connections is not changed, but rather only the level of the voltage difference between the cell connection 1 and the cell connection 2 is changed. The threshold voltages produced at the different operating points are shown in the following table.

| FIG. | VT where V21 > V31 | VT where V21 ≅ V31 | Cell inf. |
| --- | --- | --- | --- |
| 2A | low | low | 0 M |
| 2B | high | low | 1 M' |
| 2D, 3 | high | high | 2 M''' |

In addition to producing symmetry or asymmetry within the MOS transistor T, the symmetry or asymmetry is brought about in a further embodiment by additional components, such as diodes or resistors.

FIG. 4 illustrates an MOS field-effect transistor, the source/drain region of which is connected via a diode D1 to the cell connection 1, the drain/source region of which is connected via a diode D2 to the cell connection 2 and the gate connection of which is connected to the cell connection 3. Depending on the programming, the diode D1 can be bridged here by an electrically conductive link K and the diode D2 by an electrically conductive link K'. The manner in which four different states can be stored in a corresponding memory cell by this means can be inferred from the following table.

| Diode at cell connection | V(2) − V(1) | Cell state | Cell inform. |
| --- | --- | --- | --- |
| — | >0 | on | 0 0 M |
|  | <0 | on |  |
| 1 | >0 | off | 0 1 M' |
|  | <0 | on |  |
| 2 | >0 | on | 1 0 M'' |
|  | <0 | off |  |
| 1 and 2 | >0 | off | 1 1 M''' |
|  | <0 | off |  |

FIG. 5 shows a sectional diagram of an advantageous embodiment of the memory cell of FIG. 4, a $p^+$-type region being inserted into the source/drain region S/D, which is $n^+$-doped, for example, in this case, in order to form the diode D1 and a $p^+$-type region likewise being inserted into the drain/source region D/S, which is $n^+$-doped, for example, in this case, in order to form the diode D2. For the purpose of programming, the diodes can be bridged, in a mask-programmable read-only memory (ROM), by means of contact holes, which are etched through the $p^+$-type region as far as the $n^+$-doped source/drain region or drain/source region and contains contact links K and K'. Programming can therefore take place by means of an additional contact hole mask.

For electrical programming, the diodes must be able to be bridged individually. This can take place, for example, by application of a high voltage, which produces a permanent conductive link by burning through an oxide isolation layer, for example.

As an alternative, it is also possible individually to interrupt originally existing conductive links by fuse blowing.

FIG. 6 differs from FIG. 4 only in that resistors R1 and R2 are provided instead of the diodes D1 and D2. Asymmetry can be produced here by virtue of the fact that a resistor in the source supply line leads to a greater current decrease than a resistor in the drain supply line.

The resistance of the cell connection regions can be altered by the density of the dopants and the depth of the doped region. The contact hole resistance can also be influenced by production, for example by the design of the barrier. Programming can likewise take place, as described in the case of the embodiment of FIG. 4, by means of an additional mask or electrically.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Multi-value read-only memory cell, having symmetrical construction for storing one of a first state and a second state and having asymmetrical construction for storing at least a third state, comprising:

a MOS field-effect transistor having a source/drain region situated in a semiconductor body and having a drain/source region situated in the semiconductor body;

in order to store the first state, a first cell connection connected directly to the source/drain region of the MOS field-effect transistor and a second cell connection connected directly to the drain/source region of the MOS field-effect transistor;

in order to store the second state, the first cell connection connected via a first component to the source/drain region of the MOS field-effect transistor, and the second cell connection connected via a second component to the drain/source region of the MOS field-effect transistor;

in order to store the third state, the first cell connection connected via the first component to the source/drain region of the MOS field-effect transistor, and the second cell connection connected directly to the drain/source region of the MOS field-effect transistor;

in order to store a fourth state, the first cell connection connected directly to the source/drain region of the MOS field-effect transistor, and the second cell connection connected via the second component to the drain/source region of the MOS field-effect transistor;

a third cell connection connected to a gate electrode of the MOS field-effect transistor, the gate electrode being electrically insulated from the semiconductor body by an insulation layer (ISO); and the first component being a first diode and the second component being a second diode.

2. The multi-value read-only memory cell according to claim 1, wherein, in order to form the first diode, the first cell connection is connected via a first supplementary region to the source/drain region of the MOS field-effect transistor and, in order to form the second diode, the second cell connection is connected via a second supplementary region to the drain/source region of the MOS field-effect transistor;

wherein, in order to store the first state, first and the second supplementary regions are bridged by metallic contact links of the first and second connections, which contact links have a deep structure and extend at least as far as the source/drain region and drain/source region;

wherein, in order to store the second state, both the first and the second supplementary regions are contacted only by metallic contact links of the first and second connections, which contact links have a planar configuration and extend only at least as far as the first and second supplementary regions;

wherein, in order to store the third state, only the first supplementary region is bridged by a metallic contact link of the first connection, which contact link has a deep structure and extends at least as far as the source/drain region; and wherein, in order to store the fourth state, only the second supplementary region is bridged by a metallic contact link of the first connection, which contact link has a deep structure and extends at least as far as the drain/source region.

3. A multi-value read-only memory cell, having symmetrical construction for storing a first state and a second state and having asymmetrical construction for storing at least a third state, comprising:

a MOS field-effect transistor having a source/drain region situated in a semiconductor body and having a drain/source region situated in the semiconductor body;

in order to store the first state a first cell connection connected directly to the source/drain region of the MOS field-effect transistor, and a second cell connection connected directly to the drain/source region of the MOS field-effect transistor;

in order to store the second state, the first cell connection connected via a first component to the source/drain region of the MOS field-effect transistor and the second cell connection connected via a second component to the drain/source region of the MOS field-effect transistor;

in order to store the third state, the first cell connection connected via the first component to the source/drain region of the MOS field-effect transistor, and the second cell connection connected directly to the drain/source region of the MOS field-effect transistor;

in order to store a fourth state, the first cell connection connected directly to the source/drain region of the MOS field-effect transistor, and the second cell connection connected via the second component to the drain/source region of the MOS field-effect transistor;

a third cell connection connected to a gate electrode of the MOS field-effect transistor, the gate electrode being electrically insulated from the semiconductor body by an insulation layer; and the first component being a first resistor and the second component being a second resistor.

* * * * *